United States Patent
Womac et al.

(10) Patent No.: US 8,421,547 B2
(45) Date of Patent: Apr. 16, 2013

(54) SYSTEM AND METHOD FOR RETAINING A DESIRED RETURN LOSS WHEN DYNAMICALLY VARYING A NUMBER OF ACTIVE PATHS

(75) Inventors: Michael Womac, McKinney, TX (US); Jan-Michael Stevenson, Frisco, TX (US)

(73) Assignee: CSR Technology Inc., Sunnyvale, CA (US)

( * ) Notice: Subject to any disclaimer, the term of this patent is extended or adjusted under 35 U.S.C. 154(b) by 365 days.

(21) Appl. No.: 12/784,291

(22) Filed: May 20, 2010

(65) Prior Publication Data

US 2011/0285476 A1 Nov. 24, 2011

(51) Int. Cl.
*H03H 7/38* (2006.01)
(52) U.S. Cl.
USPC .................................. 333/17.3; 333/124
(58) Field of Classification Search ................. 333/17.3, 333/124, 126, 129, 132, 32, 33
See application file for complete search history.

(56) References Cited

U.S. PATENT DOCUMENTS

| | | | |
|---|---|---|---|
| 4,682,176 A | 7/1987 | Jones | |
| 5,548,246 A | 8/1996 | Yamamoto et al. | |
| 5,737,035 A | 4/1998 | Rotzoll | |
| 6,961,368 B2 | 11/2005 | Dent et al. | |
| 7,417,508 B1 | 8/2008 | Quaglietta | |
| 7,667,542 B2 | 2/2010 | Kasha et al. | |
| 2004/0185916 A1 | 9/2004 | Chang et al. | |
| 2004/0251960 A1 | 12/2004 | Macedo | |
| 2007/0207746 A1 | 9/2007 | Huang et al. | |
| 2007/0275686 A1 | 11/2007 | Stevenson et al. | |
| 2008/0284539 A1* | 11/2008 | Tateoka et al. | 333/124 |
| 2009/0295472 A1 | 12/2009 | Vice | |

OTHER PUBLICATIONS

U.S. Appl. No. 12/632,648, Stevenson.

* cited by examiner

*Primary Examiner* — Stephen Jones
(74) *Attorney, Agent, or Firm* — Fulbright & Jaworski L.L.P.

(57) ABSTRACT

When dynamically varying a number of active paths in a system, a desired return loss is maintained. Certain embodiments enable dynamic varying of the impedance of parallel signal paths in a system responsive to the number of active ones of the parallel paths dynamically changing, in order to maintain a relatively constant impedance match between a source and the combination of parallel paths, thereby retaining a desired return loss.

19 Claims, 5 Drawing Sheets

SYSTEM AND METHOD FOR RETAINING A DESIRED RETURN LOSS WHEN DYNAMICALLY VARYING A NUMBER OF ACTIVE PATHS

CROSS-REFERENCE TO RELATED APPLICATIONS

The present application is related to the following concurrently filed and commonly assigned U.S. Pat. No. 5,737,035, entitled, "HIGHLY INTEGRATED TELEVISION TUNER ON A SINGLE MICROCIRCUIT," issued Apr. 7, 1998; U.S. Pat. No. 6,177,964, entitled, "BROADBAND INTEGRATED TELEVISION TUNER," issued Jan. 23, 2001; U.S. patent application Ser. No. 11/441,816, entitled, "AGC SYSTEM AND METHOD FOR BROADBAND TUNERS," filed May 26, 2006; and U.S. patent application Ser. No. 12/632,648, entitled, "SYSTEMS AND METHODS PROVIDING MULTI-PATH LOW NOISE AMPLIFIERS WITH SEAMLESS SWITCHING," filed Dec. 7, 2009, the disclosures of which are hereby incorporated herein by reference.

TECHNICAL FIELD

The disclosure relates generally to communication and signal processing and, more particularly, to dynamically vary impedance for parallel paths in a system responsive to the number of active ones of the parallel paths dynamically changing.

BACKGROUND OF THE INVENTION

In many systems, such as within many electronic circuits, impedance mismatches can cause an undesired amount of return loss, which may result for instance from some amount of signal reflection. In metallic conductor systems, for example, reflections of a signal traveling down a conductor can occur at a discontinuity or impedance mismatch. Signal reflection may occur when a signal is transmitted along a transmission medium, such as a copper cable or an optical fiber, where some of the signal power is reflected back to its origin rather than being carried all the way along the cable to the far end. This signal reflection may occur due to impedance mismatches along the transmission path.

In radio frequency (RF) design practice, this is often measured in a dimensionless ratio known as VSWR. The ratio of energy bounced back depends on the impedance mismatch. In RF systems, an attenuator may be implemented to ensure that, in addition to acting as an attenuator, the RF impedance (return loss) of both the input and output of the attenuator is held as close as possible to the desired system impedance. Failure to maintain a proper impedance match can greatly affect the system frequency response (power transfer) and noise figure.

When receiving a broadband of signals with multiple receivers, maintaining return loss on a single input pin is particularly difficult. Return loss tends to degrade significantly as the number of parallel paths connected to the single input is increased. In some systems, multiple, parallel input paths may exist with signals coming from one input source. It is often desirable to maintain a relatively constant return loss for the system. Thus, the system may be implemented with a fixed impedance between its input and output, thereby providing a constant return loss through the system. For instance, the impedance of each of the multiple paths may be fixed to provide a desired impedance match with the input source.

BRIEF SUMMARY OF THE INVENTION

It may be desirable to implement a system in which the number of active or enabled parallel paths that are coupled to a source dynamically vary. If the number of paths that are enabled or active within a system varies from time to time, then maintaining impedance matching and thus maintaining a relatively constant return loss becomes difficult. That is, if the impedance of each of the multiple, parallel paths in the system is fixed, as in the above-mentioned traditional system, then total impedance across the system varies with the number of active paths. Accordingly, as the number of active paths within the system changes, so does the total impedance of the paths, which results in varying degrees of impedance matching between the paths and the input source, thereby causing different amounts of return loss. It thus becomes desirable for the system to dynamically vary impedances of the parallel active paths as the number of such active paths varies, thereby maintaining a relatively constant impedance match with the source.

The present invention is directed generally to systems and methods for retaining a desired return loss when dynamically varying a number of active paths in a system. Certain embodiments enable dynamic varying of the impedance of parallel signal paths in a system responsive to the number of active ones of the parallel paths dynamically changing, in order to maintain a relatively constant impedance match between a source and the combination of parallel paths, thereby retaining a desired return loss.

In one embodiment, a plurality of circuits are included in a system that are each communicatively coupled with a common source via a respective one of a plurality of parallel signal paths. For instance, "N" number of circuits may be included in a system, where N is any number greater than one, and a plurality of parallel signal paths are employed for communicatively coupling each of the circuits with a source. In one embodiment, the source may be a cable, such as a 75 ohm coaxial cable, that is coupled with the system (e.g., for carrying signals to/from the system). Of course, the source may be any other component with which the plurality of circuits are communicatively coupled for which impedance matching is desired to manage/limit return loss. Within the system, the number of the N circuits that are active may dynamically vary from time to time in accordance with embodiments of the present invention. According to certain embodiments of the present invention, the impedance matching of the system with the source is maintained relatively constant even as the number of active circuits dynamically vary. For instance, the impedance matching is maintained consistent with the impedance matching observed during normal operation of the system (e.g., during times when the number of active paths remains constant) even while the number of active circuits/paths dynamically varies.

In one embodiment, a system comprises a plurality of parallel signal paths that are each communicatively coupled between a respective one of a plurality of circuitry and a common source. The system further comprises variable impedance circuitry for dynamically varying impedance of one or more of the parallel paths to maintain impedance matching with the common source relatively constant while a number of the parallel paths that are active dynamically varies. The plurality of circuitry may, for example, comprise receivers, which may include low noise amplifiers (LNAs).

In certain embodiments, variable impedance circuitry is implemented on each of the plurality of parallel signal paths for dynamically varying impedance of its respective one of the plurality of parallel signal paths. For instance, in certain embodiments, the plurality of parallel signal paths comprise "N" number of signal paths (with N being any number greater than one), and N number of variable impedance circuitry are implemented, where each of the N number of variable impedance circuitry is operable to dynamically vary impedance of a respective one of the N number of parallel signal paths.

In one embodiment, control circuitry is implemented for receiving a request to dynamically vary a number of the parallel signal paths that are active. Responsive to such request, the control circuitry controls the variable impedance circuitry for dynamically varying impedance of one or more of the parallel paths to maintain impedance matching with the common source relatively constant as the request is satisfied. In certain embodiments, the variable impedance circuitry is controlled to incrementally adjust impedance of one or more of the parallel paths over a period of time. The incremental adjustment of impedance may be sufficiently gradual as to avoid a spike in impedance mismatch with the common source that is inconsistent with normal operation of the system while the number of active parallel paths remains constant.

Thus, certain embodiments of the present invention enable a number of parallel paths that are active in a system to be dynamically varied, wherein the parallel paths are each communicatively coupled between a respective one of a plurality of circuitry and a common source. Further, such number of active parallel paths may be dynamically varied while maintaining a relatively constant return loss. For instance, variable impedance circuitry dynamically tunes impedance of one or more of the parallel paths to maintain impedance matching with the common source relatively constant during the varying of the number of parallel paths that are active. In certain embodiments, the impedance tuning is performed to maintain the impedance matching sufficiently constant to avoid a spike in impedance mismatch with the common source. Thus, the impedance matching with the common source may be maintained consistent with normal impedance matching with the common source, i.e., the impedance matching with the common source during operation of the system in which the number of active parallel paths remains constant.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

The word "exemplary" is used herein to mean "serving as an example, instance, or illustration." Any embodiment described herein as "exemplary" is not necessarily to be construed as preferred or advantageous over other embodiments.

Figure 1:
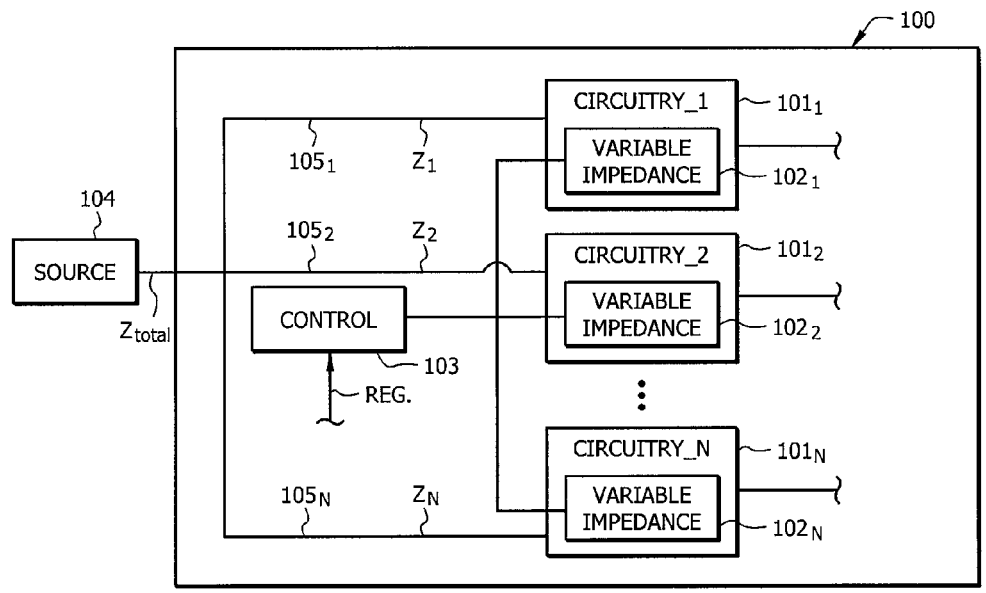
FIG. 1 shows a block diagram representation of an exemplary system according to one embodiment of the present invention.

FIG. 1 shows a block diagram representation of an exemplary system 100 according to one embodiment of the present invention. System 100 includes a number of circuitry $101_1$-$101_N$ that are communicatively coupled via input paths $105_1$-$105_N$ with an external input source 104. The input paths $105_1$-$105_N$ are, in this example, parallel paths coupled with the single input source 104. In one embodiment, the external input source 104 may be a cable, such as a 75 ohm coaxial cable, that is coupled with the system (e.g., for carrying signals to/from the system), but of course other types of sources (e.g., optical fiber cable, Ethernet cable, token ring cable, antenna, etc.) for communicatively coupling with the paths $105_1$-$105_N$ may be implemented in a given system, wherein a desired amount of impedance matching is desired therewith. The external input source 104 is an interface between an external system and the system 100. The total possible number, "N", of circuitry that may be activated within system 100 may be any number greater than 1 in accordance with embodiments of the present invention, as may be desired for a given implementation or application. In this exemplary system 100, the number of active ones of circuitry $101_1$-$101_N$ may vary from time to time, and the return loss is maintained relatively constant as the number of active circuitry changes.

Circuitry $101_1$-$101_N$ may be any type of circuitry that is communicatively coupled (e.g., via input paths $105_1$-$105_N$) with some source 104 for communicating (e.g., receiving and/or sending) information (e.g., signals) between the source 104 and circuitry $101_1$-$101_N$. In certain embodiments, as shown in the example of FIG. 1, the source 104 is an input source, and the variable impedance matching techniques disclosed herein are performed for matching impedance between the system 100 and the external input source 104. In other embodiments, the variable impedance matching techniques disclosed herein may be applied additionally or instead for achieving impedance matching between system 100 and an external output source (to which output of system 100 is communication). As discussed further herein, in certain embodiments the external source 104 may include a cable transmission system and circuitry $105_1$-$105_N$ contained in system 100 that interfaces with source 104 may comprise receivers, which may include tuners, such as the exemplary receivers disclosed in U.S. patent application Ser. No. 11/441, 816 entitled "AGC SYSTEM AND METHOD FOR BROADBAND TUNERS," U.S. Pat. No. 5,737,035, entitled, "HIGHLY INTEGRATED TELEVISION TUNER ON A SINGLE MICROCIRCUIT," U.S. Pat. No. 6,177,964, entitled, "BROADBAND INTEGRATED TELEVISION TUNER," and U.S. patent application Ser. No. 12/632,648, entitled, "SYSTEMS AND METHODS PROVIDING MULTI-PATH LOW NOISE AMPLIFIERS WITH SEAMLESS SWITCHING." Of course, in other embodiments, circuitry $101_1$-$101_N$ may be other types of circuitry (e.g., repeaters, etc.). Further, in certain embodiments circuitry $101_1$-$101_N$ may not all be of the same type but may instead be a mixture of different types of circuitry (e.g., a mixture of receivers, repeaters, etc.).

In this exemplary embodiment of FIG. 1, each of circuitry $101_1$-$101_N$ includes variable impedance circuitry $102_1$-$102_N$. Each of variable impedance circuitry $102_1$-$102_N$ is operable to change the impedance of the input path to its respective circuitry $101_1$-$101_N$. In this example, as the number of active ones of input paths $105_1$-$105_N$ varies within system 100 (e.g., as one of circuitry $101_1$-$101_N$ is enabled or disabled), one or more of variable impedance circuitry $102_1$-$102_N$ dynamically adjusts the impedance of its respective circuitry $101_1$-$101_N$ to maintain the return loss relatively constant. Such variable impedance circuitry $102_1$-$102_N$ may be implemented in any suitable manner for dynamically varying impedance, as those of ordinary skill in the art will readily appreciate, and one exemplary implementation of such circuitry that may be employed in accordance with embodiments of the present invention is discussed further below with reference to FIG. 5.

In the exemplary embodiment of FIG. 1, control circuitry 103 controls the variable impedance circuitry $102_1$-$102_N$. Control circuitry 103 may be implemented in any suitable manner, examples of which may include a microprocessor executing software code for controlling the variable impedance circuitry, an application-specific integrated circuit (ASIC), a field-programmable gate array (FPGA), or the like. For instance, responsive to a request being received by control circuitry 103, requesting a change to the number of active ones of input paths $105_1$-$105_N$ within system 100 (e.g., requesting that an additional one of circuitry $101_1$-$101_N$ be enabled or requesting one of the active ones of circuitry $101_1$-$101_N$ be disabled), control circuitry 103 controls one or more of variable impedance circuitry $102_1$-$102_N$ to dynamically adjust the impedance of its respective circuitry $101_1$-$101_N$ to maintain the return loss relatively constant for satisfying the requested change to the number of active input paths. As discussed further below (e.g., with reference to FIG. 2), in certain embodiments, control circuitry 103 controls one or more of variable impedance circuitry $102_1$-$102_N$ to gradually adjust the impedance of its respective circuitry $101_1$-$101_N$ (e.g., in a multiple step fashion) to maintain the return loss relatively constant over time, thereby avoiding or minimizing an instantaneous spike in impedance mismatch as a change in the number of active paths occurs.

It is typically desirable to match the parallel combination of impedance of the active paths $105_1$-$105_N$ with that of the input source 104 to a desired degree in order to have an acceptable amount of return loss. For example, the impedance $Z_{total}$ of the input from the source 104 should be matched (to a desired extent) with the parallel combination of the impedances $Z_1, Z_2, \ldots, Z_N$ of the active, parallel input paths $105_1$-$105_N$. For instance, if the impedance of $Z_{total}$ is 75 ohms, then it may be desired for the parallel combination of the impedances $Z_1, Z_2, \ldots, Z_N$ of the active, parallel input paths $105_1$-$105_N$ to total 75 ohms. In this case, if only circuitry $101_1$ is active, then the impedance $Z_1$ of the input path $105_1$ for circuitry $101_1$ should effectively match the desired $Z_{total}$. For instance, in general $$\frac{1}{Z_{total}} = \frac{1}{Z_1} + \frac{1}{Z_2} + \ldots + \frac{1}{Z_N};$$

and any of the parallel paths that is not active may have its respective Z value set sufficiently high such that its contribution to the total impedance of the combination of parallel paths is negligible. For instance, as any one or more of $Z_1$-$Z_N$ are made sufficiently high (e.g., as they approach infinity), their respective contributions to the total impedance of the combination of parallel paths is negligible. Thus, if only circuitry $101_1$ is active, then the impedance $Z_1$ of the input path $105_1$ for circuitry $101_1$ should effectively match the desired $Z_{total}$, as the amounts of $Z_2$-$Z_N$ may each be set sufficiently high as to have only negligible contribution to the overall impedance. Then, if circuitry $101_2$ is activated (in addition to circuitry $101_1$ being active), then the parallel combination of the impedances $Z_1$ and $Z_2$ of the active, parallel input paths $105_1$ and $105_2$ for circuitry $101_1$ and $101_2$ should match the desired $Z_{total}$.

To maintain a relatively constant return loss, a relatively constant matching of the source impedance ($Z_{total}$) to the impedance of the active ones of parallel input paths $105_1$-$105_N$ should be maintained. In order to achieve that matching with a variable number of "N" input paths being active at any time, the impedance per path is programmable in this embodiment. So, when there is only one active path (e.g., the input path $105_1$ for circuitry $101_1$), then that input impedance (e.g., impedance $Z_1$) should equal some amount to maintain a desired relationship with the source impedance ($Z_{total}$) in order to maintain a relatively constant, desired return loss. As the number of active input paths within system 100 increases, the impedance of each of the active, parallel paths changes (by the variable impedance circuitry $102_1$-$102_N$ under control of control circuitry 103) accordingly so that the combined parallel total will equal the amount for maintaining the desired relationship with the source impedance ($Z_{total}$) in order to maintain a relatively constant, desired return loss. Thus, this exemplary embodiment is highly programmable to enable the number of active ones of input paths $105_1$-$105_N$ to dynamically vary such that any number from 1 to "N" of the parallel input paths $105_1$-$105_N$ may be active at any time, and the impedance of each active path is dynamically adjusted or "tuned" to maintain the return loss relatively constant through such dynamic variation in the number of active paths.

In one embodiment, each input path can have its impedance tuned (e.g., via the variable impedance circuitry of its respective circuitry) across a range of impedances. Thus, any of the input paths $105_1$-$105_N$ may be tuned to be, as examples, a dominant impedance or a minimal contributor impedance. For example, suppose all "N" input paths $105_1$-$105_N$ are active at a given time, and the parallel combination of impedances of those "N" input paths matches to the $Z_{total}$ source impedance. Then, as one or more of the input paths $105_1$-$105_N$ are deactivated (e.g., the corresponding circuitry $101_1$-$101_N$ is turned off or disconnected), the impedances of the remaining active input paths dynamically adjust (via their respective variable impedance circuitry) to maintain the match of the parallel combination of those impedances with the $Z_{total}$ source impedance (and thus the return loss) relatively constant. For instance, in one embodiment, as one of circuitry $101_1$-$101_N$ is deactivated, its respective variable impedance circuitry $102_1$-$102_N$ adjusts its impedance higher (e.g., to make its respective Z value sufficiently high such that the contribution of such deactivated circuitry to the total impedance of the combination of parallel paths is negligible), and then the variable impedance circuitry of the remaining active circuitry adjust each of their impedances a little lower to keep the parallel combination of impedance relatively constant. If another of the circuitry $101_1$-$101_N$ is deactivated, its respective variable impedance circuitry $102_1$-$102_N$ adjusts its impedance higher, and then the variable impedance circuitry of the remaining active circuitry adjust each of their impedances a little further lower to keep the parallel combination of impedance relatively constant.

Figure 2:
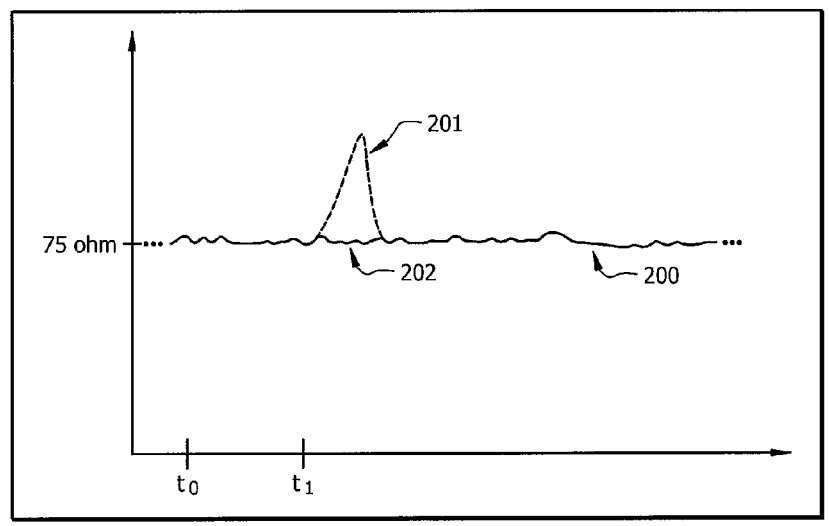
FIG. 2 shows a graph illustrating an example of impedance for the parallel combination of a number of active parallel input paths in a system over time.

Preferably, the control circuitry 103 controls one or more of variable impedance circuitry $102_1$-$102_N$ to gradually adjust the impedance of its respective circuitry $101_1$-$101_N$ (e.g., in a multiple step fashion) to maintain the return loss relatively constant over time, thereby avoiding or minimizing an instantaneous spike in impedance mismatch as a change in the number of active paths occurs. For instance, FIG. 2 shows a graph illustrating an example of an impedance 200 for the parallel combination of a number of active parallel input paths $105_1$-$105_N$ over time. In this example, it is desirable to maintain the parallel combination of impedance 200 relatively constant at 75 ohms. In the illustrated example, an additional one of the parallel input paths is activated at time $t_1$, which would result in an instantaneous spike 201 in impedance, if not accounted for. For instance, suppose that system 100 of FIG. 1 supports up to ten of the parallel circuitry, i.e., "N" equals 10. Further suppose that at time t0 four of the ten circuitry $101_1$-$101_N$ are active; and then at time t1 a request is received (e.g., by control circuitry 103) to activate a fifth of the circuitry $101_1$-$101_N$. Again, such activation of the additional circuitry would result in an instantaneous spike 201 in impedance, if not accounted for. However, certain embodiments of the present invention avoid such instantaneous spike 201 and instead gradually adjust the impedance to maintain it relatively constant, as represented by the relatively constant impedance 202 at time $t_1$ in FIG. 2.

Thus, by controllably tuning the impedance (via one or more of variable impedance circuitry $102_1$-$102_N$) for stepping up or down the impedance of one or more of the parallel input paths little by little over some period of time in order to arrive at the desired impedances, a very large instantaneous change (or spike) can be avoided in favor of making very small instantaneous changes. The small instantaneous changes can be spread out (or distributed) over a relatively long period of time relative to the demodulation, and as a result the overall large change can be made without causing significant signal degradation at any time.

The amount of degradation encountered during the small instantaneous changes that occur over the relatively long period of time relative to the demodulation will preferably be sufficiently small as to resemble normal changes that are commonly encountered within the system (i.e., during its operation when a change in the number of active input paths is constant), and thus the change is the number of active paths may not result in a recognizable difference in the consistency of impedance (or return loss) observed over time.

In some conventional systems, such as that disclosed in U.S. Pat. No. 7,417,508 titled "Multiple RF Path Amplifiers" (hereafter "the '508 patent"), a system may have a fixed input impedance matching circuit and a fixed output impedance matching circuit implemented for maintaining impedance matching with external interfaces. For instance, the '508 patent describes with reference to its FIG. 4, a microwave amplifier system 495 that includes a fixed input matching circuit 410 and a fixed output matching circuit 470 that are employed for interfacing with an external network via microwave input port 400 and microwave output port 480, respectively, see e.g., col. 6, lines 38-62. The '508 patent proposes variable output impedance matching between its internal amplifier (which is arranged within system 495 between the fixed input matching circuit 410 and the fixed output matching circuit 470) and the fixed output matching circuit 470. The '508 patent is concerned with impedance matching of its internal amplifier and a fixed output matching circuit 470, rather than matching with an input source. In addition, the '508 patent is directed to varying impedance for matching of its internal amplifier an a fixed output matching circuit 470 of the system 495, rather than varying impedance for matching of the system 495 with the external interface. That is, while impedance matching is varied internally within system 495 for matching impedance of its internal amplifier with the system's fixed output matching circuit 470, the impedance matching with an external interface (e.g., the microwave output port 480 is achieved though the use of the fixed output matching circuit 470). Moreover, the '508 patent does not appear to propose any gradual adjustment of the impedance to avoid an instantaneous spike, such as spike 201 shown in FIG. 2.

As discussed further herein, certain embodiments of the present invention employ dynamic adjustment of impedance within a system 100 in response to a change in the number of active ones of circuitry $101_1$-$101_N$ within the system so as to maintain impedance relatively constant for matching with an external interface. In this regard, a fixed input matching circuit and/or fixed output matching circuitry (as implemented in the '508 patent) is not required for interfacing with an external interface, such as a cable, antenna, microwave port, etc., for interfacing with a network. Additionally, in certain embodiments, as disclosed further herein, the dynamic adjustment of impedance is performed in a relatively gradual manner to allow for the adjustment in real-time without disturbing the signals on the active ones of the circuitry $101_1$-$101_N$ (i.e., without incurring the spike 201 shown in FIG. 2).

Figure 3:
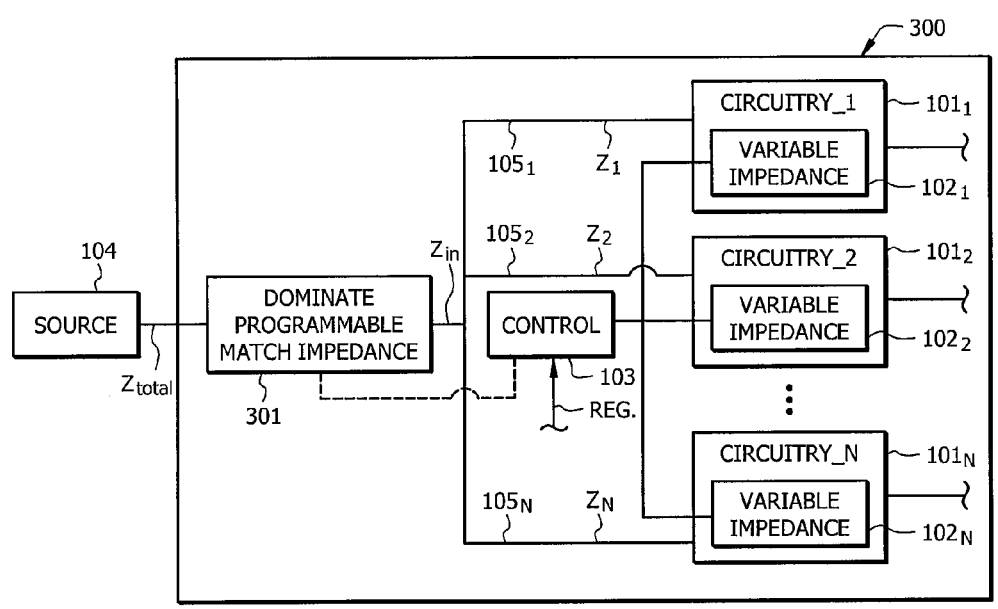
FIG. 3 shows a block diagram representation of another exemplary system, according to one embodiment of the present invention.

To aid in minimizing the magnitude of change in impedance that may be needed as a result of a change in the number of active ones of input paths $105_1$-$105_N$, in one embodiment an additional dominate programmable match impedance block may be included for providing a portion of the impedance. For instance, FIG. 3 shows a block diagram representation of an exemplary system 300 that further includes such a dominate programmable match impedance block 301, according to one embodiment of the present invention. As with system 100 of FIG. 1, system 300 again includes a number of circuitry $101_1$-$101_N$ that are communicatively coupled via input paths $105_1$-$105_N$ with an input source 104. Each of circuitry $101_1$-$101_N$ again includes variable impedance circuitry $102_1$-$102_N$ which may be controlled by control circuitry 103 to change the impedance of the input paths $105_1$-$105_N$, as discussed above with FIG. 1.

In this example, an additional circuitry block 301 is inserted between the source 104 and the parallel input paths $105_1$-$105_N$ to provide a portion of the impedance. That is, block 301 provides a portion of the impedance that when added with the parallel combination of impedance of the active ones of paths $105_1$-$105_N$ preferably results in an impedance that matches to a desired extent with the impedance of source 104. For example, the impedance $Z_{total}$ of the input from the source 104 should be matched (to a desired extent) with the impedance 4, provided by the dominate programmable match impedance block 301 and the parallel combination of the impedances $Z_1, Z_2, \ldots, Z_N$ of the active, parallel input paths $105_1$-$105_N$. For instance, if the impedance of $Z_{total}$ is 75 ohms, then it may be desired for 4, plus the parallel combination of the impedances $Z_1$, $Z_2$, $Z_N$ of the active, parallel input paths $105_1$-$105_N$ to total 75 ohms.

By implementing some magnitude of Zin, the magnitude of change in impedances $Z_1$-$Z_N$ that must be performed on paths $105_1$-$105_N$ can be reduced, thereby further aiding in reducing the amount of instantaneous change that is required responsive to a change in the number of active paths $105_1$-$105_N$. As an example, the dominate programmable match impedance block 301 may be configured to supply approximately half of the desired impedance (e.g., about half of the desired 75 ohms in the above example). Any suitable circuitry may be employed for implementing block 301, such as a microprocessor, ASIC, FPGA, etc. In certain embodiments, block 301 may provide a constant/fixed impedance (e.g., providing a constant impedance of, say, half of 75 ohms), wherein in other embodiments, block 301 may be programmable to dynamically vary (e.g., under the control of circuitry 103) its impedance from time to time.

Further, in certain embodiments, in response to a request to change the number of active paths, the impedance of multiple ones of the parallel active paths $105_1$-$105_N$ may be dynamically adjusted to maintain a relatively constant impedance match with source 104. In certain embodiments, not only is the input impedance maintained constant based on the number of active paths, but the impedance is maintained relatively constant over time as the circuitry coupled to the various parallel paths turns on and off. So, in certain embodiments, each of the paths is gradually changed in small step increments so as not to change the behavior of the other paths as ones of circuitry $101_1$-$101_N$ dynamically turn on and off.

Figure 4:
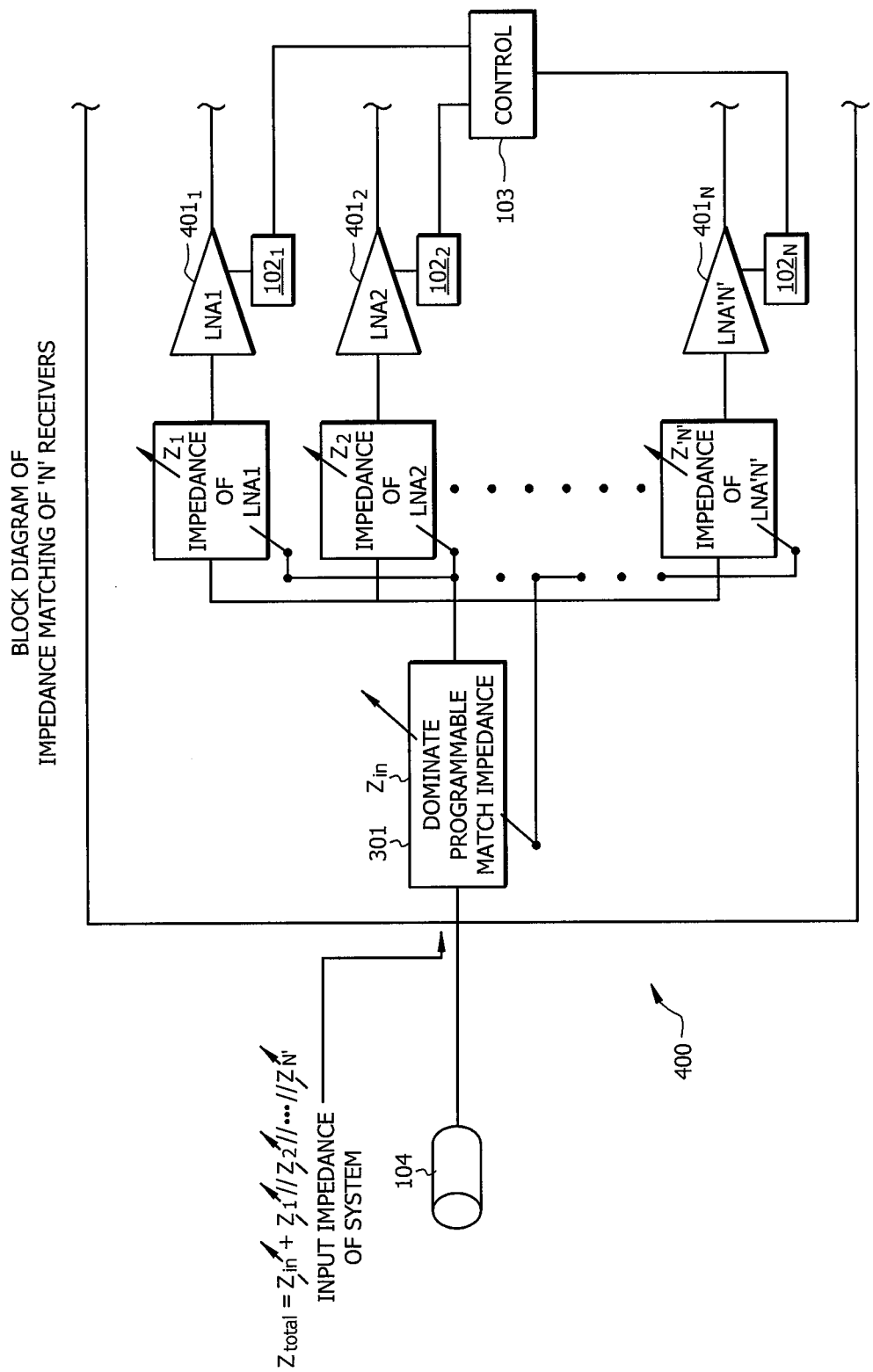
FIG. 4 shows an exemplary system in which a plurality of receivers are coupled to a common source (e.g., coaxial cable), according to one embodiment of the present invention.

In certain embodiments, circuitry $101_1$-$101_N$ of FIGS. 1-2 may be a plurality of receivers (e.g., comprising tuners). FIG. 4 shows an exemplary system 400 in which a plurality of receivers are coupled to a common source (e.g., coaxial cable) 104. In this example, each receiver comprises a low noise amplifier (LNA) that receives signals, shown as LNAs $401_1$-$401_N$. Of course, further components are typically also included in the receivers, as those of ordinary skill in the art will readily recognize. In certain embodiments, the receivers may be adapted to operate with very low noise figures while accommodating a broad input frequency band (e.g., 50 MHz to 1 GHz cable television band) and signals of multiple modes provided at different signal levels, such as through the use of a LNA operable to provide desired low noise and linearity throughout a gain range.

In this example of FIG. 4, each of LNAs $401_1$-$401_N$ comprises respective variable impedance circuitry $102_1$-$102_N$ that is controlled by control circuitry 103 in the manner described further herein. This exemplary implementation of FIG. 4 shows an embodiment consistent with that of FIG. 3 discussed above, wherein circuitry $101_1$-$101_N$ of FIG. 3 is a LNA $401_1$-$401_N$ in FIG. 4. Thus, in this exemplary implementation of FIG. 4, dominate programmable match impedance block 301, as discussed above with FIG. 3. Of course, in other embodiments, the system 400 having the plurality of receivers may omit such dominate programmable match impedance block 301, such as discussed with the exemplary system 100 of FIG. 1 above.

It may be desirable to implement a system that is capable of demodulating multiple bands at the same time. Thus, for instance, a system like system 400 of FIG. 4 may be implemented to include N number of individual receivers (or "tuners") working all at the same time, but all tied to the single source input 104. As one example, the input band may be digitized, and chunks of it may be filtered into N (e.g., ten) different tuners to attune the different frequencies. Such a system may be implemented to effectively provide a digital gateway where the spectrum is captured at an input point within a location (e.g., within a residential house) and then it is distributed. So, there may be a single box at some input point of a house, for example, where fiber or other input source 104 comes in, and the entire bandwidth is captured and portions of the band are partitioned (e.g., by system 400) and sent to different places in the house. For instance, a 1 gigahertz (GHz) input band may be captured, and it may be split into ten 100 megahertz (MHz) wide chunks. Traditionally, such input band is not being split up (or distributed) in this manner, but instead a single tuner is typically implemented that can only take at most 100 MHz total. Therefore, in such traditional implementation all of the channels needed have to reside in that 100 MHz. However, exemplary system 400 may allow for a 1 GHz input band to be received via source 104, and split into, say ten 100 MHz chunks (e.g., where N=10) that may be communicated over the N parallel paths to LNAs $401_1$-$401_N$. Any of the LNAs $401_1$-$401_N$ may be dynamically turned on or off, thereby dynamically varying the number of active ones of the parallel paths, and embodiments of the present invention provide techniques for maintaining the return loss relatively constant through such changes.

Figure 5:
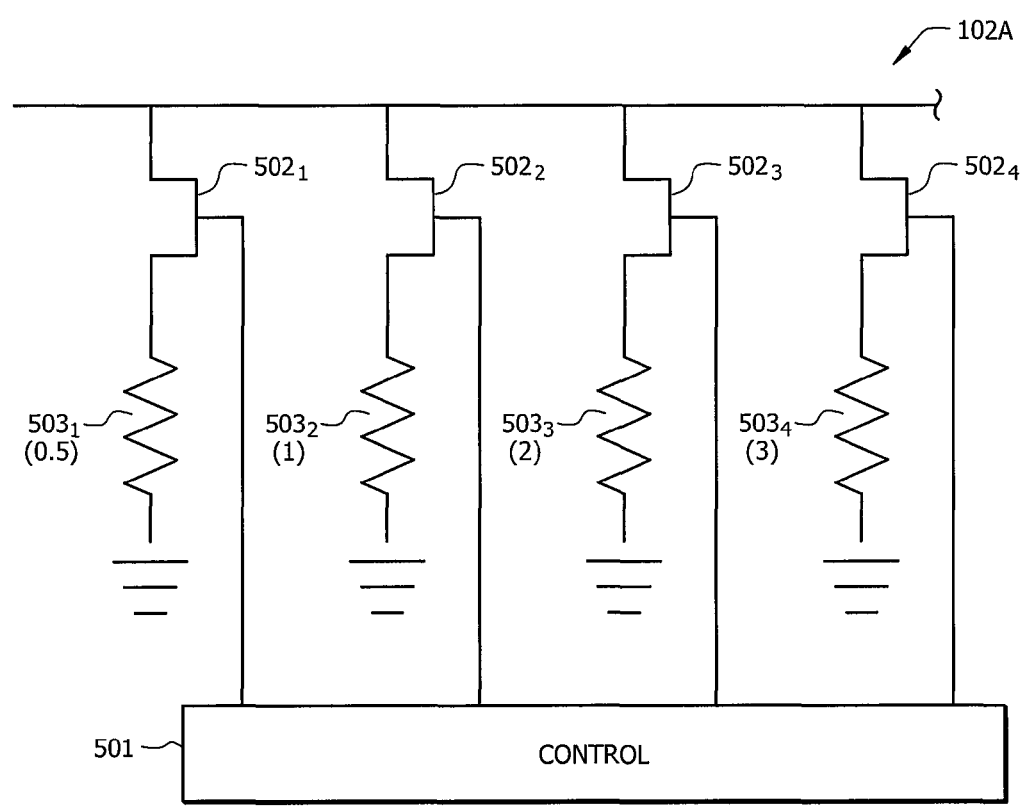
FIG. 5 shows one exemplary implementation of variable impedance circuitry that may be implemented in accordance with embodiments of the present invention.

FIG. 5 shows one exemplary implementation of variable impedance circuitry 102A that may be implemented (e.g., as variable impedance circuitry $102_1$ in FIGS. 1, 3, and 4). Of course, other implementations of variable impedance circuitry may be employed in accordance with embodiments of the present invention as those of ordinary skill in the art will readily recognize. In the example of FIG. 5, a plurality of shunt resistors $503_1$-$503_4$ are implemented, any of which may be controllably switched in via control circuitry 501 selectively turning on any of field effect transistors (FETs) $502_1$-$502_4$. While four shunt resistors are illustrated in this example, any number of such shunt resistors may be implemented in a given implementation to allow for a desired range of impedance tuning. The shunt resistors may be implemented to effectively correspond to a binary counting arrangement. For instance, resistors $503_1$-$503_4$ may be 0.5 ohm, 1 ohm, 2 ohm, and 4 ohm, respectively.

Control circuitry 501, which may be control circuitry 103 of FIGS. 1 and 3 or which may be communicatively coupled with control circuitry 103. Responsive to a requested change in the number of active input paths $105_1$-$105_N$, control circuitry 501 may selectively turn ones of FETs $502_1$-$502_4$ on or off over a period of time to progressively step the corresponding impedance upward or downward to a desired amount for a corresponding one of the input paths in order to maintain the impedance relatively constant over time. In this way, the instantaneous spike 201 shown in FIG. 2 can be avoided, and instead a relatively constant impedance (such as 202 in FIG. 2) can be maintained through occurrence of a change in the number of active ones of the parallel input paths $105_1$-$105_N$.

As one illustrative example of gradually adjusting impedance of the parallel paths within one system in order to maintain a relatively constant total impedance of the combination of parallel paths while the number of active ones of such paths varies, suppose that system 100 (of FIG. 1) includes ten receivers (i.e., N=10, and where circuitry $101_1$-$101_N$ each comprise a receiver), and further suppose that, with reference to FIG. 2, at time $t_0$ four of the ten receivers are active. Then, at time $t_1$ a request is made for a fifth of the receivers to go active. If not accounted for, such activation of the additional receiver would result in an instantaneous spike 201 in impedance, as shown in FIG. 2. In accordance with one embodiment, operations may be performed for gradually adjusting the impedances of one or more of the parallel paths to avoid such a spike 201, and instead maintain the total impedance of the combination of parallel paths relatively constant 202.

For instance, before the fifth receiver is activated, its respective variable impedance circuitry may be set to provide a sufficiently high Z value such that its contribution to the total impedance of the combination of parallel paths is negligible. For instance, all of the FETs $502_1$-$502_4$ of the variable impedance circuitry of such fifth receiver may be on, thereby providing a high total Z value. When the fifth receiver is activated, the variable impedance circuitry of the fifth receiver may gradually decrease its total impedance, each by selectively turning ones of the FETs $502_1$-$502_4$ on/off over a period of, say, one symbol period, for example, of a particular digital communication standard. This may be on the order of 1 millisecond (ms) per adjustment, for example. Therefore, for this example, it may take a maximum of 4 ms for gradually varying the impedance. Further, at the same time the variable impedance circuitry of one or more of the other four active parallel paths may adjust their respective impedances, such that at the end of the 4 ms adjustment period (in the above example), the total impedance for the combination of the five active receivers totals that previously observed for the four active receivers at time $t_0$.

By way of example, it may be desirable in some instances to add 9 receivers to one receiver (for the exemplary N=10 case discussed above), which may require 4×9×1 ms=36 ms amount of time to make the transition in the above example. This technique may be employed if a change by just one element of FIG. 5 would cause an event, such as the 201 spike in FIG. 2.

Figure 6:
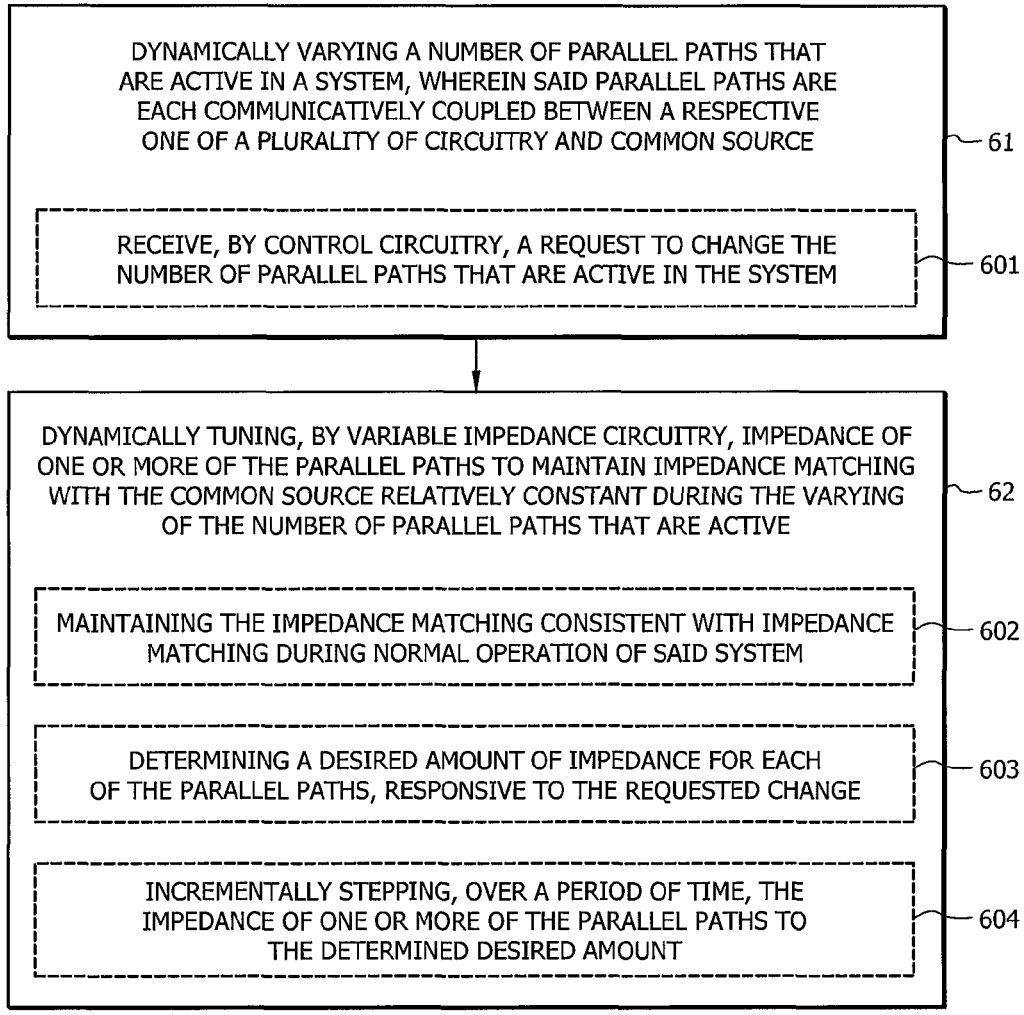
FIG. 6 shows an exemplary operational flow diagram according to one embodiment of the present invention.

FIG. 6 shows an exemplary operational flow diagram according to one embodiment of the present invention. In block 61, a number of parallel paths that are active in a system is dynamically varied, wherein the parallel paths are each communicatively coupled between a common source and a respective one of a plurality of circuitry. In certain embodiments, a request to change the number of active parallel paths (e.g., a request to activate or deactivate respective circuitry, such as a receiver) is received by control circuitry, such as control circuitry 103 discussed above.

In operational block 62, variable impedance circuitry (e.g., circuitry $102_1$-$102_N$ discussed above) dynamically tunes the impedance of one or more of the parallel paths to maintain the impedance matching with the common source relatively constant during the varying of the number of parallel paths that are active. For instance, in certain embodiments, the impedance matching is maintained consistent with the impedance matching encountered during normal operation of the system (i.e., during times when a change to the number of active parallel paths is not occurring), as indicated in block 602. In this way, a noticeable difference (such as a spike) in the impedance matching is not observed when changing the number of active ones of the parallel paths, in accordance with certain embodiments of the present invention. As one example, FIG. 2 illustrates a graph showing relatively constant impedance matching to 75 ohms that may be observed when varying the number of active ones of the parallel paths in the system (thereby avoiding spike 201), in accordance with certain embodiments of the present invention.

In certain embodiments, a desired amount of impedance for each of the parallel paths is determined (e.g., by control circuitry 103) responsive to the requested change, as indicated in operational block 603. Thus, when activating or deactivating ones of circuitry $101_1$-$101_N$, a determination may be made as to the amount of impedance to be set for each of the parallel paths to maintain a relatively constant impedance matching with source 104. In certain embodiments, the impedance of one or more of the parallel paths is then incrementally adjusted (or stepped) little by little over a period of time to its respective determined desired amount of impedance, as indicated by block 604. As discussed above, by gradually adjusting the impedance of the parallel paths in small increments over a period of time, a large instantaneous spike (e.g., spike 201 of FIG. 2) that may cause an increase in return loss and thus undesired signal degradation can be avoided.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system comprising:
   a plurality of parallel signal paths that are each simultaneously communicatively coupled between a respective one of a plurality of circuitry and a common external source; and
   variable impedance circuitry for dynamically varying impedance of one or more of the parallel paths to maintain impedance matching with the common source relatively constant while a number of the parallel paths that are active dynamically varies.

2. The system of claim 1 wherein said common external source comprises an interface with an external network.

3. The system of claim 1 wherein said common external source comprises an input source for receiving input via an external network.

4. The system of claim 1 wherein said common external source comprises a cable or an antenna.

5. The system of claim 1 wherein said plurality of circuitry comprise receivers.

6. The system of claim 1 wherein said plurality of circuitry comprise low noise amplifiers (LNAs).

7. The system of claim 1 wherein said variable impedance circuitry comprises:
   for each of said plurality of parallel signal paths, variable impedance circuitry for dynamically varying impedance of its respective one of the plurality of parallel signal paths.

8. The system of claim 1 wherein said plurality of parallel signal paths comprise "N" number of signal paths, said N number being any number greater than one, and wherein said variable impedance circuitry comprises N number of variable impedance circuitry, each of said N number of variable impedance circuitry being operable to dynamically vary impedance of a respective one of said N number of parallel signal paths.

9. The system of claim 1 further comprising:
control circuitry for receiving a request to dynamically vary a number of the parallel signal paths that are active, and responsive to said request, for controlling said variable impedance circuitry for dynamically varying impedance of one or more of the parallel paths to maintain impedance matching with the common external source relatively constant as the request is satisfied.

10. The system of claim 1 wherein a fixed impedance matching circuit is not implemented between the plurality of circuitry and the common external source.

11. A system comprising:
a plurality of parallel signal paths that are each communicatively coupled between a respective one of a plurality of circuitry and a common external source;
variable impedance circuitry for dynamically varying impedance of one or more of the parallel paths to maintain impedance matching with the common source relatively constant while a number of the parallel paths that are active dynamically varies; and
control circuitry for receiving a request to dynamically vary a number of the parallel signal paths that are active, and responsive to said request, for controlling said variable impedance circuitry for dynamically varying impedance of one or more of the parallel paths to maintain impedance matching with the common external source relatively constant as the request is satisfied, wherein said controlling said variable impedance circuitry comprises causing said variable impedance circuitry to incrementally adjust impedance of said one or more of the parallel paths over a period of time.

12. The system of claim 11 wherein the incremental adjustment of impedance is sufficiently gradual as to avoid a spike in impedance mismatch with the common external source that is inconsistent with normal operation of said system while the number of active parallel paths remains constant.

13. A system comprising:
a plurality of parallel signal paths that are each communicatively coupled between a respective one of a plurality of circuitry and a common external source;
means for receiving a request to dynamically vary a number of the parallel signal paths that are active; and
means, responsive to said request, for dynamically varying impedance of one or more of the parallel paths to maintain, as the request is satisfied, impedance matching with the common external source consistent with normal impedance matching with the common external source, said normal impedance matching being impedance matching with the common external source during operation of said system in which the number of active parallel paths remains constant.

14. The system of claim 13 wherein said common external source comprises an input source, wherein said plurality of circuitry comprise a plurality of receivers, wherein said input source provides a broadband signal, and wherein said broadband signal is partitioned into a plurality of portions, each of said portions being directed to a respective one of the receivers.

15. The system of claim 13 wherein a fixed impedance matching circuit is not implemented between the plurality of circuitry and the common external source.

16. The system of claim 13 wherein said means for dynamically varying impedance comprises:
for each of said plurality of parallel signal paths, variable impedance circuitry for dynamically varying impedance of its respective one of the plurality of parallel signal paths, wherein said plurality of parallel signal paths comprise "N" number of signal paths, said N number being any number greater than one, and wherein said variable impedance circuitry comprises N number of variable impedance circuitry, each of said N number of variable impedance circuitry being operable to dynamically vary impedance of a respective one of said N number of parallel signal paths.

17. A method comprising:
dynamically varying a number of parallel paths that are active in a system, wherein said parallel paths are each communicatively coupled between a respective one of a plurality of circuitry and a common external source; and
dynamically tuning, by variable impedance circuitry, impedance of one or more of the parallel paths to maintain impedance matching with the common external source relatively constant during the varying of the number of parallel paths that are active, wherein said relatively constant impedance matching comprises sufficiently constant impedance matching to avoid a spike in impedance mismatch with the common external source that is inconsistent with normal operation of said system while the number of active parallel paths remains constant.

18. A method comprising:
dynamically varying a number of parallel paths that are active in a system, wherein said parallel paths are each communicatively coupled between a respective one of a plurality of circuitry and a common external source; and
dynamically tuning, by variable impedance circuitry, impedance of one or more of the parallel paths to maintain impedance matching with the common external source relatively constant during the varying of the number of parallel paths that are active; wherein said dynamically tuning comprises:
incrementally adjusting impedance of said one or more of the parallel paths over a period of time.

19. The method of claim 18 wherein the incremental adjustment of impedance is sufficiently gradual as to avoid a spike in impedance mismatch with the common external source that is inconsistent with normal operation of said system while the number of active parallel paths remains constant.

* * * * *